(12) United States Patent
Regen et al.

(10) Patent No.: US 7,070,425 B2
(45) Date of Patent: Jul. 4, 2006

(54) THUMB DRIVE WITH RETRACTABLE USB CONNECTOR

(75) Inventors: Paul Regen, Felton, CA (US); Peter Garrett, Aptos, CA (US); Everett Hale, Tehachapi, CA (US)

(73) Assignee: Ennova Direct, Inc., Santa Cruz, CA (US)

( * ) Notice: Subject to any disclaimer, the term of this patent is extended or adjusted under 35 U.S.C. 154(b) by 0 days.

(21) Appl. No.: 11/009,329

(22) Filed: Dec. 9, 2004

(65) Prior Publication Data

US 2005/0130471 A1 Jun. 16, 2005

Related U.S. Application Data

(63) Continuation-in-part of application No. 10/903,412, filed on Jul. 29, 2004.

(60) Provisional application No. 60/528,645, filed on Dec. 10, 2003.

(51) Int. Cl.
*H01R 13/44* (2006.01)
(52) U.S. Cl. .................................................. 439/131
(58) Field of Classification Search ................ 439/131, 439/140; 340/825.24, 825.25; 700/130–144
See application file for complete search history.

(56) References Cited

U.S. PATENT DOCUMENTS

2003/0144608 A1* 7/2003 Kojima et al. ............... 600/583
2004/0074264 A1* 4/2004 Kung ............................ 70/58

OTHER PUBLICATIONS

U.S. Appl. No. 10/903,412, Paul Regen et al.
U.S. Appl. No. 60/528,645, Paul Regen.

* cited by examiner

*Primary Examiner*—Chandrika Prasad
*Assistant Examiner*—Phuongchi Nguyen
(74) *Attorney, Agent, or Firm*—Donald R. Boys; Central Coast Patent Agency, Inc.

(57) ABSTRACT

A thumb drive comprises on-board memory for storing digital information, a male USB connector coupled to the on-board memory for connecting to a USB port of a computer appliance, internal control elements for managing MP3 player functions for the thumb drive, a display for displaying downloaded song titles, user-operable controls for selecting and playing songs recorded as audio files in the on-board memory as audio output at an output connector, a Bluetooth™ compatible transmitter for transmitting selected data and audio output to external Bluetooth™ compatible devices, and an extension/retraction mechanism coupled to the connector for extending the connector from an enclosure of the drive and for retracting the connector when not in use.

8 Claims, 9 Drawing Sheets

THUMB DRIVE WITH RETRACTABLE USB CONNECTOR

CROSS-REFERENCE TO RELATED DOCUMENTS

The present application claims priority to co-pending patent application Ser. No. 10/903,412, filed on Jul. 29, 2004 which claims priority to provisional application No. 60/528,645 filed Dec. 10, 2003. Both applications above are incorporated in their entirety by reference.

FIELD OF THE INVENTION

The present invention is in the field of computer mass storage devices, and pertains more particularly to solid-state USB connectable drives.

BACKGROUND OF THE INVENTION

In the computer arts there continues to be motivation for increased density and ease-of-use in mass storage devices. A solid state device known now in the art as a thumb drive was relatively recently introduced advancing the standard for both density and ease-of-use, and such hot-plug drives are made by several manufacturers. A common feature of thumb drives as known in the art is a male USB connector, and functionality to hot-plug and remove, that is, without turning off the computer to which the drive is connected and disconnected. Another common feature is a plastic protective cover for the male USB connector.

Although the advance in the mass storage art with the advent of thumb drives is dramatic, there are still some problems with such a system. For example, the plastic covers for use on the male USB connectors are not very secure, and tend to come loose and be lost. As a remedy, many manufacturers provide two and sometimes three plastic covers with each device sold, often with different colors. Still another problem is that USB ports on computers are not universally easily visible and accessible. Some such ports are on the back of tower cases which are often placed under desks or other furniture, so finding an unused USB female port for connecting the male USB connector of a thumb drive is often not trivial. When a female port is out of sight or in a darkened area, the connection must often be made by feel alone. Still further, when the thumb drive is connected to a computer, the plastic protective cover is removed, and is easily misplaced.

There are also other functions that may be accomplished with the considerable memory available with thumb drives, and their relatively easy connectivity to personal computers and other computerized appliances. One such function is as an MP3 player, to download MP3 files, such as music files, from a computerized appliance, and an ability to play these files into an ear piece, headphone or amplifier from the thumb drive.

Therefore what is clearly needed is a way to dispense with the plastic covers and still protect the male USB connector for thumb drives, a way to aid in the search for unused USB ports, and aid in the engagement of the male USB connector of the thumb drive with the female port on the computer, and a way to use the thumb drive as an MP3 player.

SUMMARY OF THE INVENTION

In an embodiment of the invention a thumb drive is provided, comprising on-board memory for storing digital information, a male USB connector coupled to the on-board memory for connecting to a USB port of a computer appliance, internal control elements for managing MP3 player functions for the thumb drive, a display for displaying downloaded song titles, user-operable controls for selecting and playing songs recorded as audio files in the on-board memory as audio output at an output connector, a Bluetooth™ compatible transmitter for transmitting selected data and audio output to external Bluetooth™ compatible devices, and an extension/retraction mechanism coupled to the connector for extending the connector from an enclosure of the drive and for retracting the connector when not in use.

In some embodiments the thumbdrive further comprises a set of Bluetooth™ compatible ear pieces. Also in some embodiments the ear pieces are configured to attach to a pair of glasses. Also in some embodiments the extension/retraction mechanism comprises a set of guides within a body of the thumb drive for translating the coupled memory and USB connector, and a slide button extending through an opening in the body and connected to the coupled USB port and on-board memory, wherein a user may translate the coupled memory and USB connector along the guides by urging the slide button from outside the body. The opening through the body may comprise detents which provide, in concert with the slide button, detention of the coupled memory and USB connector in a fully extended or a fully withdrawn position.

In some embodiments the on-board memory is digital flash memory, which in some cases may be equal to or exceed 256 Mbytes. In some cases there may be a light integrated into the body and directed in the same direction as extending the USB connector, and an on-board power supply for energizing the light. In some cases there may be a set of guides within a body of the thumb drive for translating the coupled memory and USB connector, and a slide button extending through an opening in the body and connected to the coupled USB port and on-board memory, wherein a user may translate the coupled memory and USB connector along the guides by urging the slide button from outside the body, and wherein depressing the button also turns on the light.

BRIEF DESCRIPTION OF THE DRAWINGS FIGURES

Figure 3A:
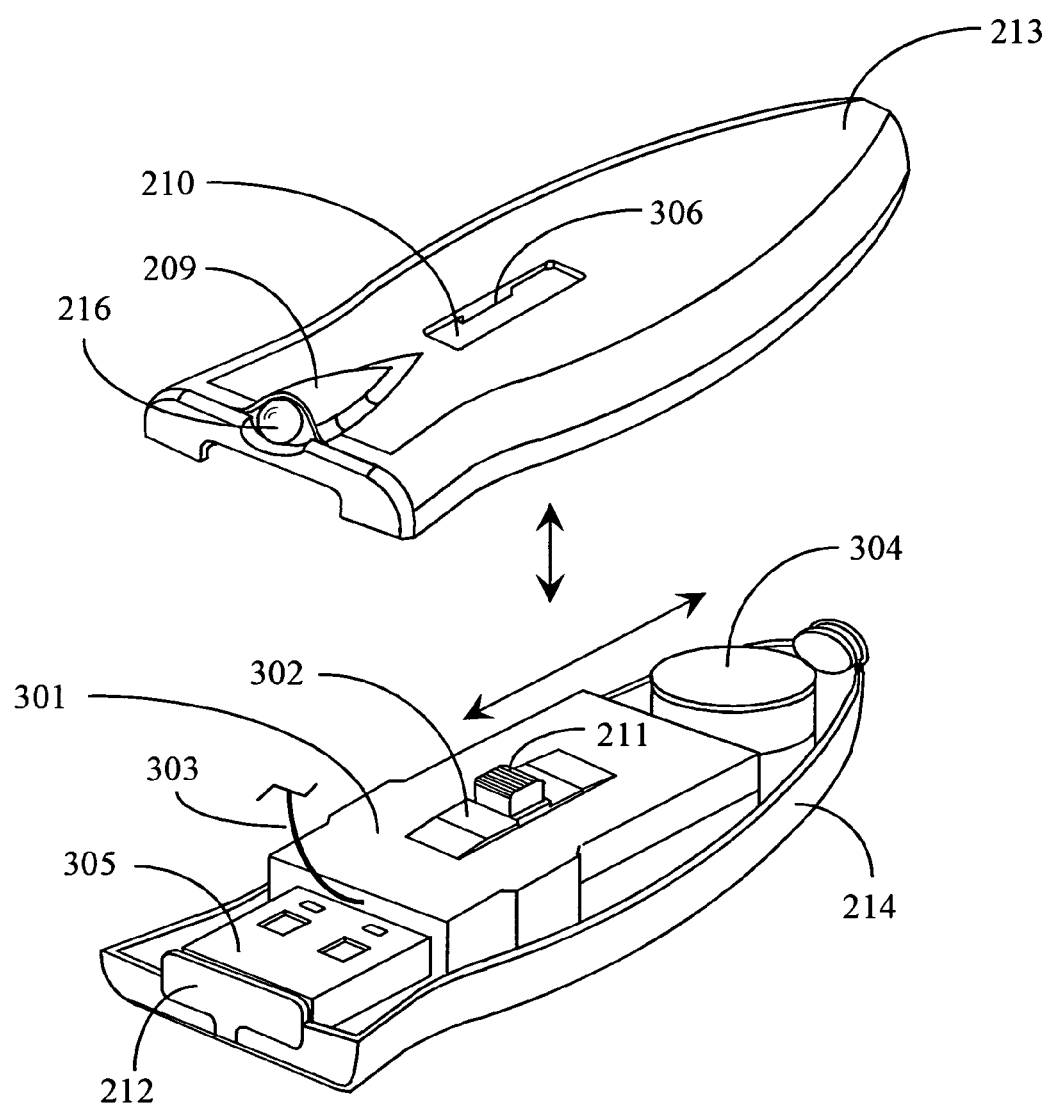
FIG. 3a is an exploded view of the thumb drive of FIG. 2.
Figure 3B:
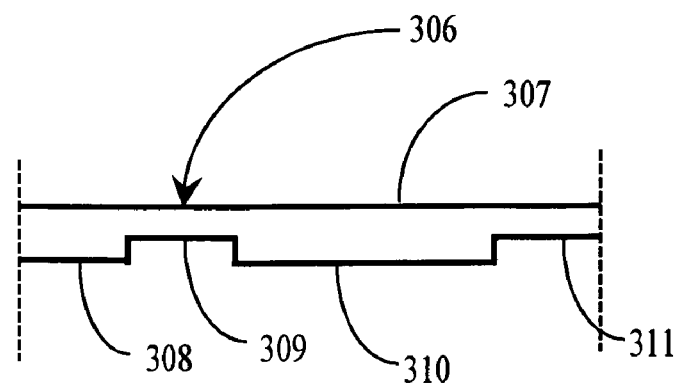

FIGS. 3b, c, and d show details for detenting in an embodiment of the invention.

Figure 4A:
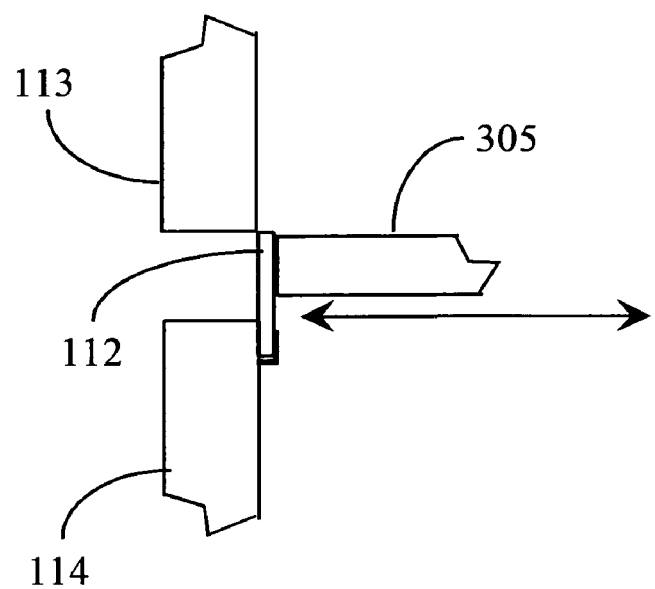
Figure 4B:
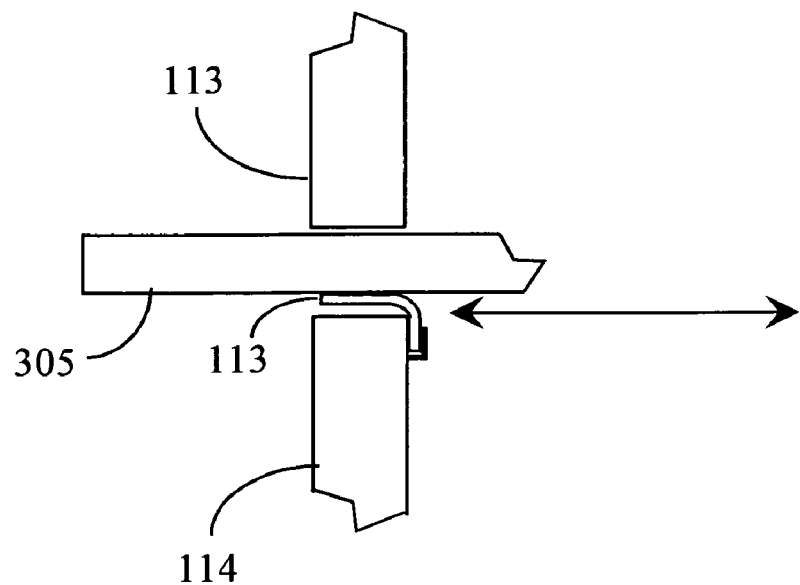

FIGS. 4a and 4b are a diagrams showing one way a protective cover may be implemented.

Figure 5:
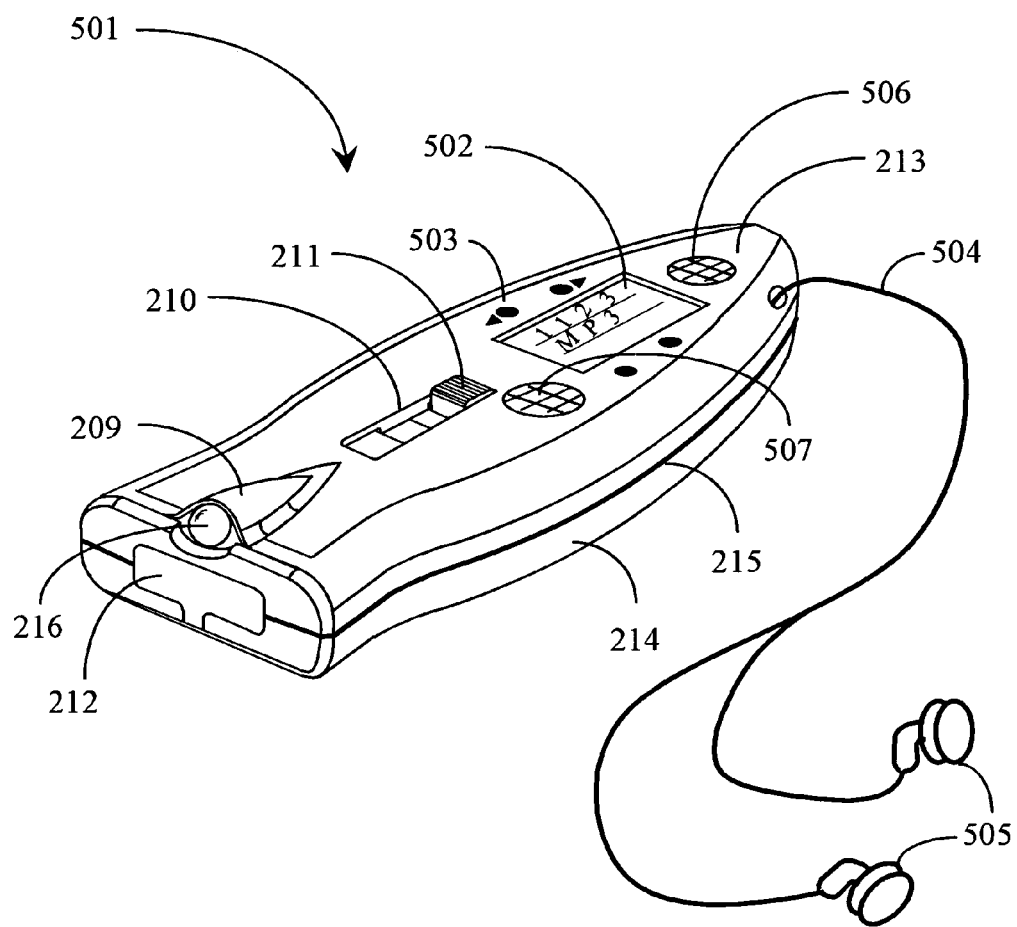

FIG. 5 is a perspective view of a thumb drive according to yet another embodiment of the invention.

Figure 6:
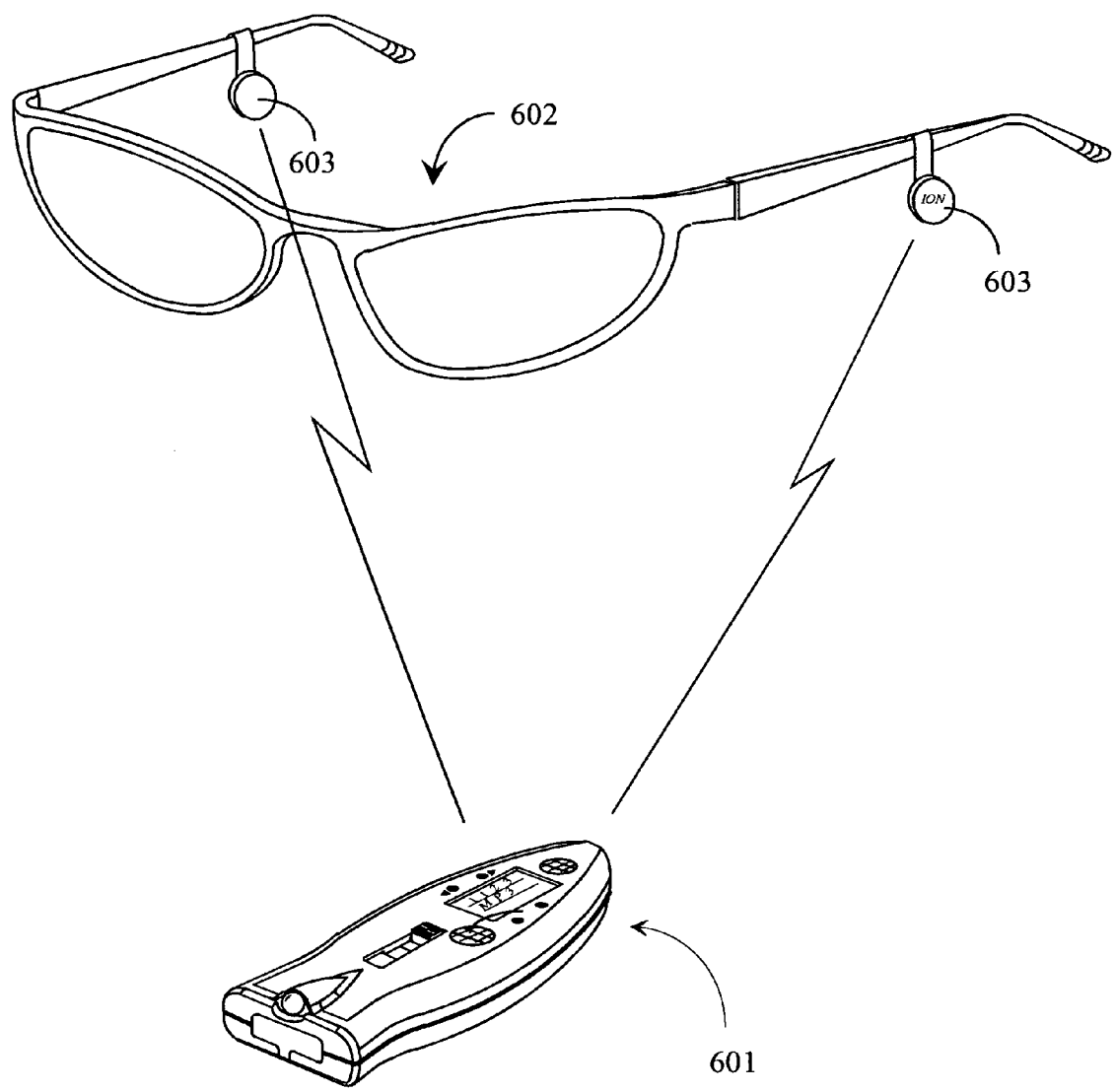

FIG. 6 is a [perspective view of a thumb drive associated with a Bluetooth™ headset in yet another embodiment of the invention.

DESCRIPTION OF THE PREFERRED EMBODIMENTS

Figure 1A:
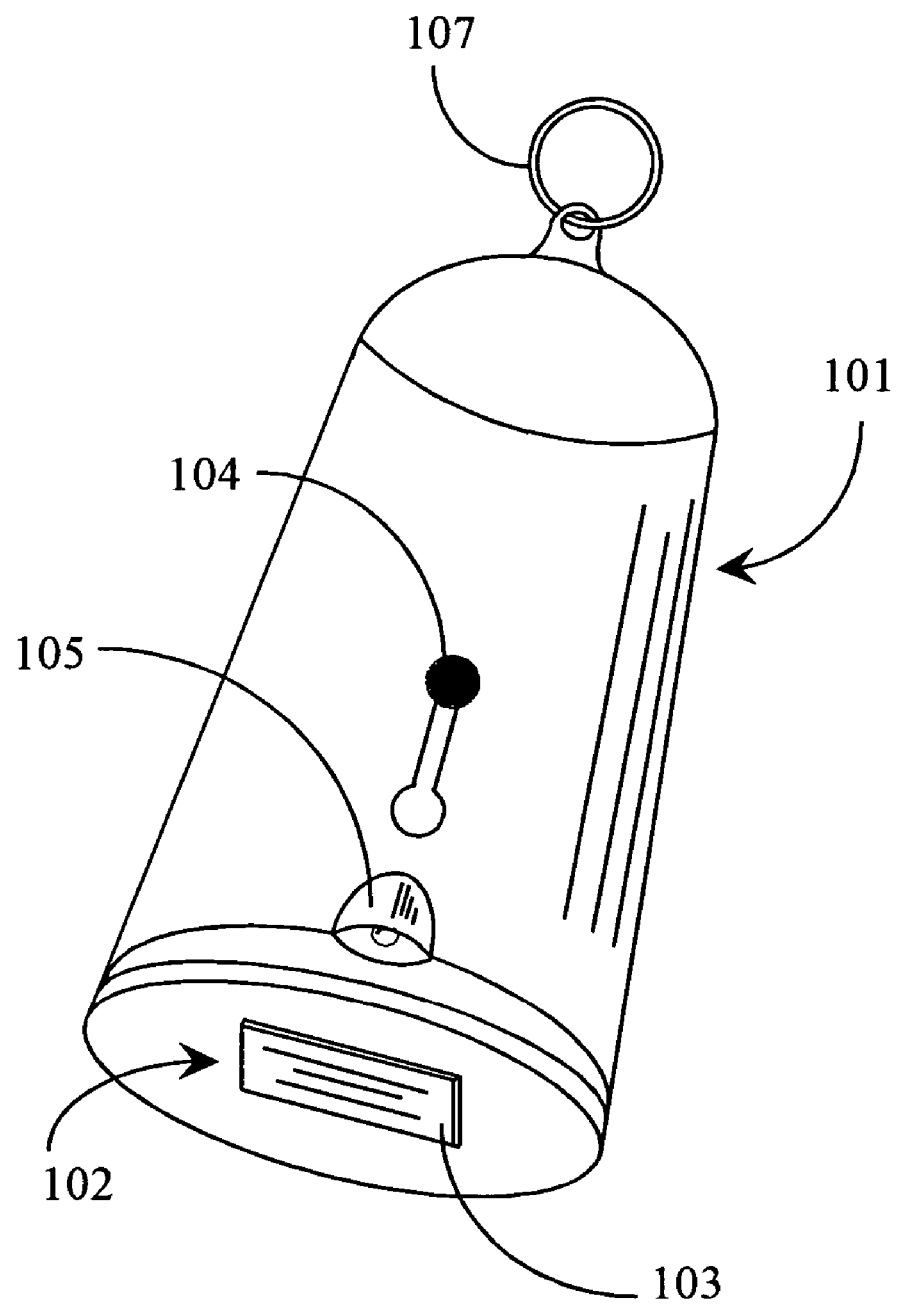
FIG. 1a is a perspective view of a thumb drive according to an embodiment of the present invention, with the connector retracted.

In one embodiment of the invention a thumb drive has a manually extendable and retractable male USB connector. FIG. 1a is a perspective view of such a drive 101 according to an embodiment of the invention.

Drive 101 has in this example a physical opening 102 generally rectangular in shape, matching the rectangular cross section of a male USB connector. Port 102 is closed, when the connector is withdrawn within a body of the thumb drive, by a retractable physical closure, such as a flap gate 103, which may be hinge mounted in one embodiment to allow passage of a male USB connector.

It will be apparent to the skilled artisan that there are a variety of ways a closure may be implemented for opening 102. Such a closure may be made of a number of different materials, such as rubber or plastic materials, and may be implemented in a number of different ways. For example, the gate could be a solid metal or rigid plastic material, and a mechanism for opening and closing may be provided also in a number of different ways.

Further to the above description, a sliding button 104 is implemented through an opening in a wall of a case for the drive. This button in one embodiment has two functions. Firstly the button is implemented in a manner to turn on a flashlight element 105 when the button is depressed. Secondly, the button is detented in a way that when depressed it may be pushed forward, causing an internal mechanism to translate forward, urging a male USB connector to extend through port 102, and to lock in place as extended. The locking in place in one embodiment is a function of the detenting of the button mechanism.

It will also be apparent to the skilled artisan that such a manual operator for translation of a mechanism to extend the male connector through opening 102 may be implemented in several ways as well, such as by a knob or a slide. In one embodiment, for example, the retractable connector is spring-loaded into the case of the thumb drive with a detent for keeping it retracted until a user trips the detent. A similar detent keeps the connector in an extended position until the user pushes the connector back into the case.

Light 105 in one embodiment is offset to one side of the thumb drive as shown, and is provided for aiding in finding a USB port on a candidate computer. The light may also be used as a utility flashlight for a number of other purposes. The skilled artisan will understand that there are a variety of ways control for the light may be provided in addition to the slide button 104, such as by a separate switch implemented through the body of the thumb drive.

Figure 1B:
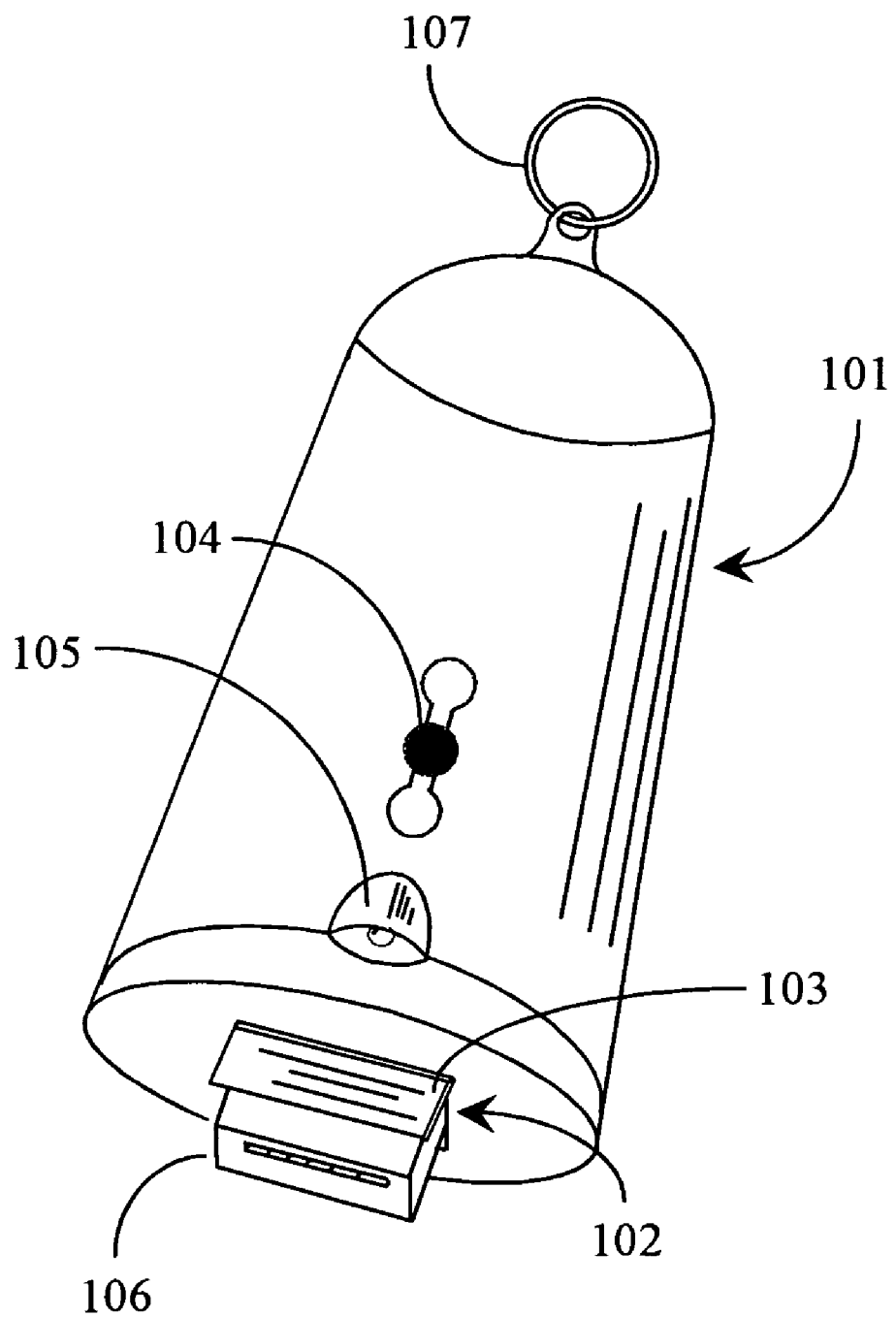
FIG. 1b is a perspective view of the thumb drive of FIG. 1a with the connector partly extended.

FIG. 1b is a perspective view of the thumb drive of FIG. 1 with a USB male connector extended part way through port 102. It may be seen that the relative position of slide button 104 corresponds to the relative extension of the USB port 106.

Figure 1C:
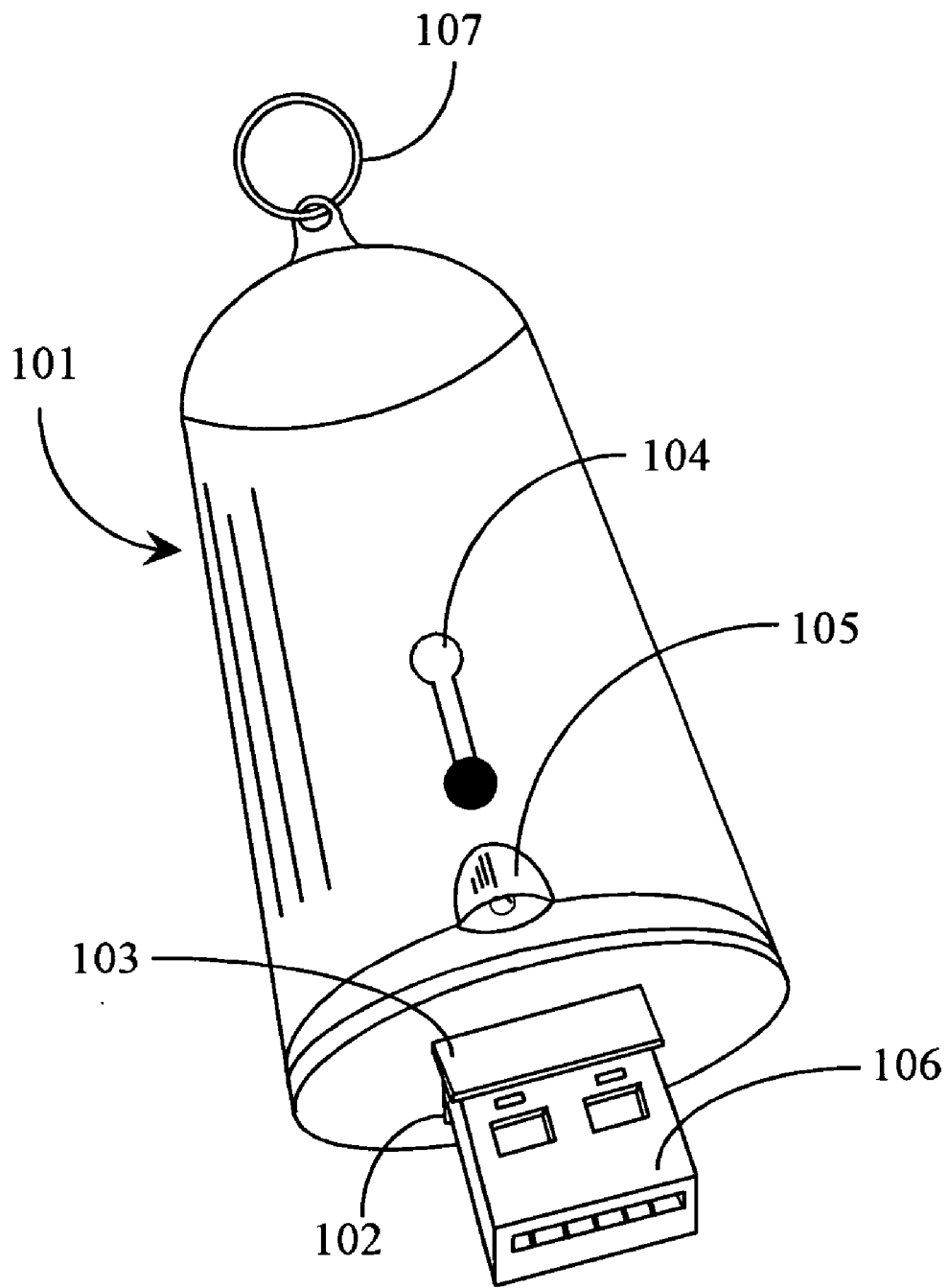
FIG. 1c is a perspective view of the thumb drive of FIG. 1a with the connector fully extended.

FIG. 1c is a perspective view of the thumb drive of FIGS. 1a and 1b with male connector 106 fully extended and locked into place. In some embodiments of the invention a connection ring 107 may be provided to facilitate attachment to a neck cord or key ring.

Figure 2:
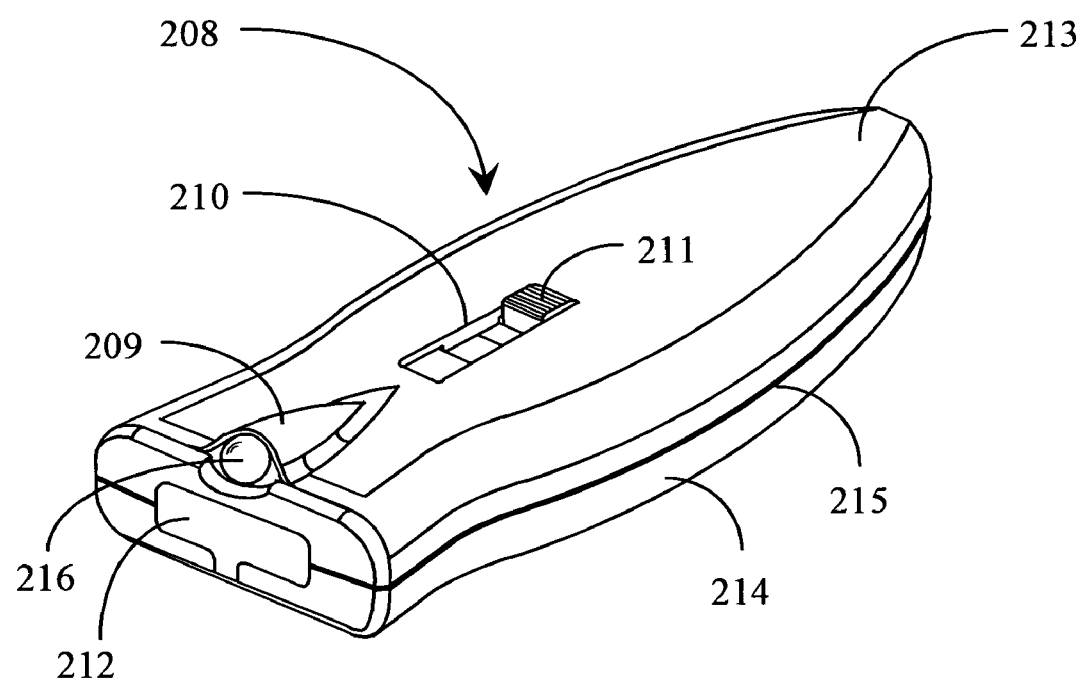
FIG. 2 is a perspective view of a thumb drive according to an alternative embodiment of the present invention.

FIG. 2 is a perspective view of a thumb drive 208 in yet another embodiment of the present invention. In this embodiment a body shape is implemented that provides a more comfortable and secure grip when using the drive. Many of the elements for the embodiment shown by FIG. 2 are the same as for the embodiment shown by FIGS. 1a–1c. There is a molded body that, in this case, is made in two separate parts 213 and 214, joining along a line 215. A raised portion 209 of the upper section 213 provides a housing for a light 216, which may be one or a cluster of high-intensity LEDs or an incandescent bulb, for example. A spring-loaded button 211 is implemented through an opening 210 in section 213 for on-off input for the light 216 and slide operation for a male USB connector that may be caused to extend through door 212 by urging button 211 forward. Detents implemented in opening 210 provide for restraining the USB connector in extended or retracted position, as further described below.

FIG. 3a is a partially exploded perspective view of thumb drive 208 of FIG. 2, showing some further detail of inner components. Section 213 is shown disconnected from section 214 and raised to show additional inner detail. Within the thumb drive a module 301 comprises flash memory, in quantity of perhaps 256 Mbytes, or more. Module 301 also comprises button 211 implemented in a structure 302 that allows the button to be depressed and to make electrical contact to energize light 216 through a connection path 303 from an on-board battery source 304. The battery can be any one of many sorts, such as a rechargeable battery.

The internal flash memory of module 301 is coupled to I/O contacts of a USB male connector 305 which is built into module 301. Internal connections, microprocessor, and firmware applying the microprocessor to functions of the apparatus are not shown, but will be apparent to those with skill in the art, as these mostly exist in the commercial arena at the time of filing the present application.

Module 301 in this an some other embodiments is implemented within the shell of portions 213 and 214 restrained between molded-in tracks, such that the module may be translated from a position wherein USB male connector 305 is fully withdrawn, to a position wherein the USB connector is fully extended, and back again. Detents molded into upper portion 213 in conjunction with opening 210 provide for retention at the filly withdrawn and near the fully extended positions, in concert with depressing button 211. To extend or withdraw one may depress button 211 and release it at the end of the movement. When USB connector 305 extends, door 212 is urged aside in a manner that when the USB connector is again withdrawn, the door closes again.

FIG. 3b shows one edge 306 of opening 210 of portion 213 in elevation. This edge of the opening is formed into lands at two elevations, these being lands 308 and 310 at a lower level and lands 309 and 311 at a higher level.

Figure 3C:
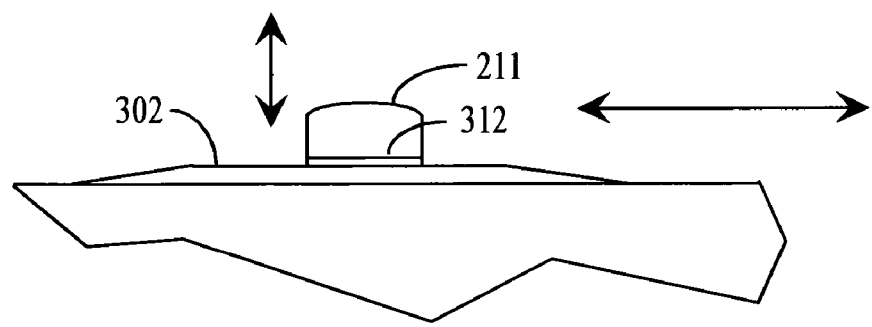

FIG. 3c shows button 211 and structure 302 implemented on module 301. As previously described, structure 302 allows button 211 to be depressed to make electrical contact to illuminate light 216. Button 211 further has a land 312, also seen in FIG. 3a in perspective that engages one of lands 308–311 in assembly, depending on the relative extension of connector 305.

Figure 3D:
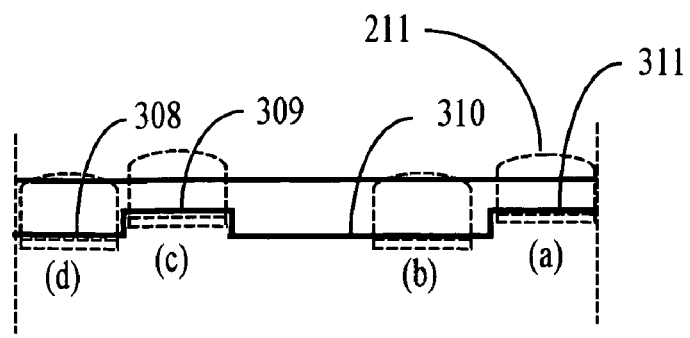

FIG. 3d shows edge 306 with lands 308–311 with button 211 superimposed at four different positions (a) through (d) representing four different extensions of connector 305. With button 211 in position (a) the male USB connector is fully retracted within the body of the thumb drive. Because button 211 is spring-loaded upward, this provides a detent that holds the connector retracted until a specific action by the user.

To move the connector forward, that is, to extend the connector, a user depresses button 211 such that land 312 of the button is below land 310 of edge 306. This depressing of button 211 makes electrical contact turning on light 216. Now module 301 may be moved forward by urging button 211 forward to extend USB connector 305. Land 310 ensures that the light stays on if the button is released.

Land 308 allows the user to move connector 305 to a maximum forward position, passing land 309, at which point the light will stay lit. This allows for the user to release the button while looking for a female USB port for connection, and keeps the light on.

When the female USB port is found and male connector 305 is inserted, the action of insertion will retract the male connector in the thumb drive until the spring-loaded button clicks up to land 309, providing a detent near the fully extended poison with the light off and the thumb drive connected to the appliance having the female USB port.

The skilled artisan will be aware that the detent mechanisms described above with reference to FIGS. 3b–3d are exemplary of one such mechanism that might be used, and that are there are a variety of other ways the detents may be provided.

One simple rendition of a door 112 or 212 is shown in FIGS. 4a and 4b. In this example a rubber-like panel 112 is affixed behind an opening between upper and lower portions 113 and 114. As connector 305 is extended from the poison shown in FIG. 4a the rubber-like panel is simply urged aside, until with full extension, panel 112 is positioned as shown in FIG. 4b. When connector 305 is again withdrawn panel 112 springs back to an upright position as shown in FIG. 4a, closing the opening to dust and debris, for example.

It will be apparent to those with skill in the art that the door for the opening through which the male USB connector protrudes, such as panel 112 in FIGS. 4a and 4b, is not in and of itself the patentable feature of the invention, but a convenience to protect the internal details of the novel thumb drive when the connector is withdrawn. Simple examples of such a door have been provided, but there are a further variety of ways such a protective door might be implemented. There might be, for example, a rigid door hinged in some manner, and the door may or may not be closed by a spring detent. There are many other possibilities as well.

In embodiments of the invention described above there is no need for a protective plastic cap for the male USB connector as is common in the art at the time of filing the present application, and the light integrated into the thumb drive in some embodiments provides real aid to a user in finding and connecting to unused USB ports. The light has other uses as a simple utility flashlight as well.

In another embodiment of the present invention, illustrated in FIG. 5, further enhancement is provided such that a thumb drive 501 may also operate as a music repository and player, such as an MP3 player. In this embodiment the memory capacity of the thumb drive is controlled in the same manner that is done in the art for MP3 players and the like, so that music and other audio material may be downloaded to the unique thumb drive from a computer device, and may be played back to a user. For this purpose a display 502 is provided, which may be an LED (light-emitting diode) or an LCD (liquid crystal display) is provided, and additional firmware for internal microprocessor control is provided to manage storage of audio files, such as MP3 files, for songs, and to display and render the songs at a user's command.

Appropriate controls, such as buttons 503 for scrolling through a playlist, are provided, and audio rendition is through line 504 to a set of ear-buds 505. Earphones may be used as well, or any set of battery-powered or conversion unit powered speakers, such as those sorts of speakers used with PCs from a soundcard. In some embodiments a microphone 506 is also provided, and controls are provided for a user to record such as memorandums and notes, using the thumb drive as a personal digital recorder. A small, built-in speaker 507 may also be implemented in some embodiments.

FIG. 6 is a perspective view of a thumb drive 601 associated with a Bluetooth™ headset in still another embodiment of the invention. Bluetooth™ is a well-known system and protocol for wireless transmission of audio and other date over relatively short distances, and information relative to same is easily accessible to the skilled artisan. In this embodiment thumb drive 601 comprises a Bluetooth™ transmitter, which transmits to left and right earpieces 603 adapted to a pair of glasses 602, such as sunglasses. The controls for thumb drive 601 are essentially the same as described above for drive 501. In alternative embodiments the Bluetooth™ earpieces may be worn separately from the glasses, or may be associated with a hat or a cap for example.

In various embodiments of the invention different features may be combined. For example, in one embodiment a retractable male USB connector is provided, but there is no light and no MP3 capability. In another there is a light, but no MP3 and no retractable connector. In yet another embodiment the light and the retractable connector are combined as shown in various embodiments described above. Different embodiments may incorporate any different combination of features.

It will be apparent to the skilled artisan that there are a broad variety of changes that may be made in the embodiments of the invention described above without departing from the spirit and scope of the invention. For example, there are a broad variety of materials that may be used for various elements of the thumb drive in embodiments of the invention. The controls in those embodiments that provide audio playback can be done in several ways. There are various ways the extendable male connector may be implemented, and the like. There are a wide variety as well of ways the control functions may be implemented. Therefore the invention should only be limited by the claims which follow.

What is claimed is:

1. A thumb drive comprising:
   on-board memory for storing digital information;
   a male USB connector coupled to the on-board memory for connecting to a USB port of a computer appliance;
   internal control elements for managing MP3 player functions for the thumb drive;
   a display for displaying downloaded song titles;
   user-operable controls for selecting and playing songs recorded as audio files in the on-board memory as audio output at an output connector;
   a transmitter for transmitting selected data and audio output to external compatible devices; and
   an extension/retraction mechanism coupled to the connector for extending the connector from an enclosure of the drive and for retracting the connector when not in use;
   wherein the extension/retraction mechanism comprises a set of guides within a body of the thumb drive for translating the coupled memory and USB connector, and a slide button extending through an opening in the body and connected to the coupled USB port and on-board memory, and a user translates the coupled memory and USB connector along the guides by urging the slide button from outside the body.

2. The thumb drive of claim 1 wherein the opening through the body comprises detents which provide, in concert with the slide button, detention of the coupled memory and USB connector in a fully extended or a fully withdrawn position.

3. The thumb drive of claim 1 wherein the on-board memory is digital flash memory.

4. The thumb drive of claim 1 wherein memory capacity is equal to or exceeds 256 Mbytes.

5. The thumb drive of claim 1 further comprising a set of ear pieces.

6. The thumb drive of claim 5 wherein the ear pieces are configured to attach to a pair of glasses.

7. The thumb drive of claim 1 further comprising a light integrated into the body and directed in the same direction as extending the USB connector, and an on-board power supply for energizing the light.

8. The thumb drive of claim 7 comprising a set of guides within a body of the thumb drive for translating the coupled memory and USB connector, and a slide button extending through an opening in the body and connected to the coupled USB port and on-board memory, wherein a user may translate the coupled memory and USB connector along the guides by urging the slide button from outside the body, and wherein depressing the button also turns on the light.

* * * * *